United States Patent
Huang et al.

(10) Patent No.: US 8,710,549 B2
(45) Date of Patent: Apr. 29, 2014

(54) MOS DEVICE FOR ELIMINATING FLOATING BODY EFFECTS AND SELF-HEATING EFFECTS

(75) Inventors: Xiaolu Huang, Shanghai (CN); Jing Chen, Shanghai (CN); Xi Wang, Shanghai (CN); Deyuan Xiao, Shanghai (CN)

(73) Assignee: Shanghai Institute of Microsystem and Information Technology, Chinese Academy of Science, Shanghai (CN)

( * ) Notice: Subject to any disclaimer, the term of this patent is extended or adjusted under 35 U.S.C. 154(b) by 0 days.

(21) Appl. No.: 13/128,439

(22) PCT Filed: Sep. 7, 2010

(86) PCT No.: PCT/CN2010/076692
§ 371 (c)(1),
(2), (4) Date: May 10, 2011

(87) PCT Pub. No.: WO2011/160337
PCT Pub. Date: Dec. 29, 2011

(65) Prior Publication Data
US 2012/0025267 A1 Feb. 2, 2012

(30) Foreign Application Priority Data

Jun. 25, 2010 (CN) .......................... 2010 1 0212134

(51) Int. Cl.
*H01L 29/66* (2006.01)
(52) U.S. Cl.
USPC ............ 257/192; 257/E29.315; 257/E21.445; 257/19; 257/286; 257/285; 438/183; 438/191; 438/265; 438/319

(58) Field of Classification Search
USPC .......................................... 257/192
See application file for complete search history.

(56) References Cited

U.S. PATENT DOCUMENTS

| | | | | |
|---|---|---|---|---|
| 5,214,295 A | * | 5/1993 | Manning ......................... | 257/67 |
| 5,578,508 A | * | 11/1996 | Baba et al. .................... | 438/270 |
| 5,627,395 A | * | 5/1997 | Witek et al. .................... | 257/350 |
| 5,760,451 A | * | 6/1998 | Yu .................................. | 257/382 |
| 6,509,615 B2 | * | 1/2003 | Iwata et al. .................... | 257/368 |
| 6,509,618 B2 | * | 1/2003 | Jan et al. ....................... | 257/413 |
| 6,528,853 B2 | * | 3/2003 | Christensen et al. ......... | 257/353 |
| 6,607,948 B1 | * | 8/2003 | Sugiyama et al. ............. | 438/151 |
| 6,624,476 B1 | * | 9/2003 | Chan et al. .................... | 257/347 |
| 6,830,962 B1 | * | 12/2004 | Guarini et al. ................. | 438/149 |
| 6,881,635 B1 | * | 4/2005 | Chidambarrao et al. ..... | 438/300 |
| 7,439,110 B2 | * | 10/2008 | Cheng et al. .................. | 438/150 |
| 7,517,764 B2 | * | 4/2009 | Booth et al. ................... | 438/300 |
| 7,550,330 B2 | * | 6/2009 | Dyer et al. ..................... | 438/151 |
| 7,737,502 B2 | * | 6/2010 | Beintner et al. .............. | 257/366 |
| 7,824,969 B2 | * | 11/2010 | Zhu ................................ | 438/137 |
| 7,851,859 B2 | * | 12/2010 | Tak et al. ....................... | 257/347 |
| 7,986,029 B2 | * | 7/2011 | Chuang et al. ................ | 257/618 |

(Continued)

*Primary Examiner* — Alexander Sofocleous
*Assistant Examiner* — Ankush Singal
(74) *Attorney, Agent, or Firm* — Global IP Services; Tianhua Gu

(57) ABSTRACT

A SOI MOS device for eliminating floating body effects and self-heating effects are disclosed. The device includes a connective layer coupling the active gate channel to the Si substrate. The connective layer provides electrical and thermal passages during device operation, which could eliminate floating body effects and self-heating effects. An example of a MOS device having a SiGe connector between a Si active channel and a Si substrate is disclosed in detail and a manufacturing process is provided.

6 Claims, 3 Drawing Sheets

(56) References Cited

U.S. PATENT DOCUMENTS

| | | |
|---|---|---|
| 2002/0086472 A1* | 7/2002 | Roberds et al. ............... 438/197 |
| 2002/0105015 A1* | 8/2002 | Kubo et al. .................. 257/285 |
| 2002/0123197 A1* | 9/2002 | Fitzgerald et al. ............ 438/285 |
| 2003/0200071 A1* | 10/2003 | Zhang et al. ..................... 703/15 |
| 2004/0061172 A1* | 4/2004 | Furukawa et al. ............ 257/347 |
| 2004/0094758 A1* | 5/2004 | Usuda et al. .................... 257/18 |
| 2005/0014294 A1* | 1/2005 | Ang et al. .......................... 438/2 |
| 2005/0045995 A1* | 3/2005 | Ieong et al. .................. 257/627 |
| 2005/0090066 A1* | 4/2005 | Zhu et al. ....................... 438/300 |
| 2005/0098094 A1* | 5/2005 | Oh et al. ........................ 117/95 |
| 2005/0151193 A1* | 7/2005 | Wong ............................ 257/347 |
| 2006/0128111 A1* | 6/2006 | Beintner et al. .............. 438/400 |
| 2006/0208342 A1* | 9/2006 | Choi et al. .................... 257/618 |
| 2006/0284270 A1* | 12/2006 | Lee et al. ....................... 257/408 |
| 2007/0001165 A1* | 1/2007 | Ranica et al. .................... 257/19 |
| 2007/0218654 A1* | 9/2007 | Spencer et al. ............... 438/478 |
| 2007/0228465 A1* | 10/2007 | Dyer et al. .................... 257/347 |
| 2007/0235807 A1* | 10/2007 | White et al. .................. 257/351 |
| 2008/0111195 A1* | 5/2008 | Atanackovic ................. 257/366 |
| 2008/0145989 A1* | 6/2008 | Oh et al. ........................ 438/296 |
| 2008/0233699 A1* | 9/2008 | Booth et al. .................. 438/283 |
| 2009/0114949 A1* | 5/2009 | Hebert .......................... 257/190 |
| 2009/0212368 A1* | 8/2009 | Yang ............................. 257/368 |
| 2009/0242964 A1* | 10/2009 | Akil et al. ..................... 257/324 |
| 2009/0309158 A1* | 12/2009 | Lin et al. ....................... 257/347 |
| 2010/0022073 A1* | 1/2010 | Fitzgerald et al. ............ 438/478 |
| 2010/0117151 A1* | 5/2010 | Lin et al. ....................... 257/347 |
| 2010/0221876 A1* | 9/2010 | Kim et al. ..................... 438/151 |
| 2010/0264469 A1* | 10/2010 | Zhu et al. ...................... 257/288 |
| 2011/0114996 A1* | 5/2011 | Fiorenza et al. .............. 257/192 |
| 2011/0140087 A1* | 6/2011 | Hellings et al. ................. 257/24 |
| 2011/0241073 A1* | 10/2011 | Cohen et al. .................. 257/192 |

* cited by examiner

MOS DEVICE FOR ELIMINATING FLOATING BODY EFFECTS AND SELF-HEATING EFFECTS

FIELD OF THE INVENTION

The present invention relates to semiconductor MOS device, and particularly, to a MOS device for eliminating floating body effects and self-heating effects, and a manufacturing method thereof.

BACKGROUND OF THE INVENTION

SOI means silicon on insulator. In SOI technique, the speed of silicon on insulator (SOI) devices is significantly improved compared to traditional bulk silicon devices, owing to reduced source and drain parasitic capacitance. Other advantages of SOI devices include improved shot-channel effect, latch-up prevention, and simpler device manufacturing. SOI devices also demonstrate high speed, low power consumption, high integration density, and high reliability. As a result, SOI has become one of the mainstream IC technologies.

However, the buried oxide layer (BOX) in a SOI structure presents two major challenges to a SOI device's performance and reliability. The first issue is the floating body charge effect and self-heating effects in SOI devices, which can lead to the devices performance degeneration and serious influences on the device reliability. With the size of the device continuing to shrink, the negative influence will be more prominent, thus greatly limiting the promotion of SOI technique. In this case, the buried oxide layer in a SOI device isolates the body region from the device, and charges generated from impact ionization cannot be quickly released. As a result, SOI devices have a tendency to accumulate charges and float electrically. In addition, the buried oxide layer in a SOI device has relatively low thermal conductivity which results in device self-heating. When the SOI device works, the buried oxide layer has high thermal resistance, and the device temperature is too high, thus affecting the device performance.

Recently a number of new device structures have been proposed to overcome the above problems, such as a SON (Silicon On Nothing) device and a DSOI (Drain/source on Insulator) device. U.S. Pat. No. 7,361,956 discloses a partially insulated field effect transistor, which has the top semiconductor layer connecting to the top surface of the bottom semiconductor layer. The connection eliminates the SOI floating body effects, and at the same time, reduces heat generated during the device operation. In addition, the source and drain parasitic capacitance is decreased, because there is a buried gap between the top and bottom semiconductor layers, where the source and drain regions are located. However, the device's manufacture process is very complicated. The process starts from opening a window from the top semiconductor layer, through the channel region, all the way to the bottom semiconductor layer, and then filling the window with specific semiconductor materials. The level of complexity in this process hinders continued device shrinking in the future.

SUMMARY OF THE INVENTION

A MOS device for eliminating floating body effects and self-heating effects, the MOS device comprises: a semiconductor substrate; an active region formed on the substrate, the active region including a gate channel, a source region and a drain region formed at the two opposite ends of the gate channel; a gate region formed over the gate channel; a buried insulation layer, formed between the substrate and the source and drain regions; a SiGe isolation layer formed between the gate channel and the substrate and a shallow trench isolation region located surrounding the active region.

Consistent with embodiments of the present invention, the SiGe layer is P-type doped in a NMOS device.

Consistent with embodiments of the present invention, the SiGe layer is N-type doped in a PMOS device.

Preferably, the gate further comprises a plurality of insulation spacers.

Preferably, the buried insulation layer comprises silicon oxide or silicon nitride.

A method of manufacturing a MOS device for eliminating floating body effects and self-heating effects, the method comprises: (a) according to priority epitaxial growing a SiGe layer and a Si layer on a Si substrate; (b) forming a first conduction type SiGe layer and a first conduction type Si layer on the Si substrate by etching and doping the SiGe layer and the Si layer, wherein the first conduction type Si layer is used for forming an active region; (c) coating photo resist layer on the first conduction type Si layer to cover the surface of a first region used for forming a gate channel, which spreads outwards from both sides to cover partial sidewalls of the first conductive SiGe layer under this region, then removing a part of the first conduction type SiGe layer under the first conduction type Si layer by selective etching, thus forming a SiGe isolation layer, so that the areas for forming source region and drain region are suspended; (d) removing the photo resist layer, and filling insulating medium around the SiGe isolation layer above the Si substrate and the first conduction type Si layer; (e) forming a gate region above the first conduction type Si layer, and forming a source region and a drain region with a second conduction type in the first conduction type Si layer by doping process to finish fabrication of the MOS device.

DETAILED DESCRIPTION OF THE EMBODIMENTS

The present disclosure is further explained in detail according to the accompanying drawings.

Figure 1:
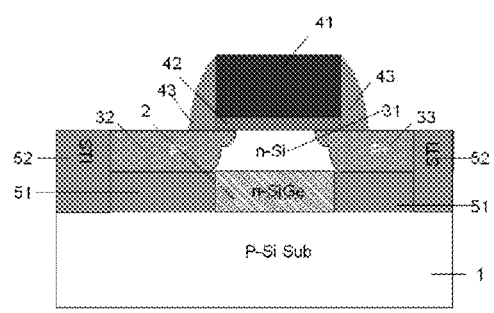
FIG. 1 is a cross sectional view of a MOS device for eliminating floating body effects and self-heating effects consistent with some embodiments of the present disclosure.

FIG. 1 provides a cross sectional view of a MOS device for eliminating floating body effects and self-heating effects. The MOS device includes a Si substrate 1; an active region located on the Si substrate 1, the active region includes a gate channel 31, a source region 32 and a drain region 33, and the source region 32 and the drain region 33 are located at the two opposite ends of the gate channel 31; a gate region located over the gate channel 31, including a gate dielectric layer 42 and a gate electrode 41 provided on the gate dielectric layer 42, wherein a pair of insulation spacers 43 is provided around the gate region; a shallow trench isolation (STI) region 52 is located surrounding the active region.

A buried insulation layer 51 is formed in the second space between the source region 32 and the Si substrate 1 to electrically isolate them, and in the third space between the drain region 33 and the Si substrate 1 to electrically isolate them. A SiGe isolation layer 2 is located between the Si substrate 1 and the gate channel 31 to separate them and as an electric and thermo passage between them.

For an NMOS device, the source region 32 and the drain region 33 are formed of heavily doped N-type semiconductor material, the gate channel 31 is formed of P-type semiconductor and the SiGe isolation layer 2 is formed of P-type SiGe. For a PMOS device (now shown), the source region 32 and the drain region 33 are formed of heavily doped P-type semiconductor, the gate channel 31 is formed of N-type semiconductor and the SiGe isolation layer 2 is formed of N-type SiGe. The buried insulation layer 51 may be formed of dielectric materials, such as silicon oxide, silicon nitride or other materials. The Si substrate 10 may be P-type Si substrate for an NMOS device, and N-type Si substrate for a PMOS device.

A method of manufacturing the MOS device eliminating floating body effects and self-heating effects includes the following steps.

(a) according to priority epitaxial grow a SiGe layer and a Si layer on a Si substrate1, the Si substrate 1 can adopt P-type Si substrate.

(b) form a first conduction type SiGe layer and a first conduction type Si layer on the Si substrate by etching and doping the SiGe layer and the Si layer, wherein the first conduction type Si layer is used for forming an active region.

(c) coat photo resist layer on the first conduction type Si layer to cover the surface of a first region used for forming a gate channel, which spreads outwards from both sides to cover partial sidewalls of the first conduction type SiGe layer under this region in order to protect the first conduction type SiGe layer under the area on both sides of the gate channel form etching, and then remove a part of the first conduction type SiGe layer under the first conduction type Si layer by selective etching. For example, sub-atmospheric chemical vapor deposition (SACVD) methods are used for selective etching with $H_2$ and HCl gases at a temperature range from 600° C. to 800° C., wherein the pressure of HCl is over 300 Torr. In the selective etch process, the first conduction type SiGe layer is etched from the sidewall to the center, forming a SiGe isolation layer 2, so that the area used for forming the source and drain regions in the first conduction type Si layer are suspended.

(d) remove the photo resist layer, and fill insulating medium around the SiGe isolation layer above the Si substrate and the first conduction type Si layer, so as to forming a buried insulation layer 51 under the both sides of the first region used for forming a gate channel in the first conduction type Si layer, and form a shallow trench isolation region 52 around the first conduction type Si layer. The insulating medium can adopt silicon oxide, silicon nitride or other materials.

(e) create a gate region above the first conduction type Si layer. The gate region includes a gate dielectric layer 42 and a gate electrode 41 provided on the gate dielectric layer 42. The material of the gate dielectric layer 42 can be silicon oxide, silicon oxynitride, or hafnium-based high dielectric constant material (High K material) and so on. The material of the gate electrode 41 can be selected from a group consisting of titanium, nickel, tantalum, tungsten, tantalum nitride, tungsten nitride, titanium nitride, titanium silicide, tungsten silicide and nickel silicide, or just be doped polysilicon. Then form a source region 32 and a drain region 33 with a second conduction type source region 32 and a second conduction drain region 33 in the first conduction type Si layer by doping process, such as ion implantation. For example, firstly form a lightly-doped-source (LDS), a lightly-doped-drain (LDD) and halos, and then form the source region 32 and the drain region 33 by the second conduction type ion implantation.

Furthermore, an insulation spacer 43 can be fabricated around the gate region, adopting silicon oxide, silicon nitride or other materials, and finally finish the MOS device.

FIGS. 2a-2g show the manufacturing process steps for a CMOS device based on the MOS device in the present invention, consistent with some embodiments of the current disclosure.

Figure 2A:
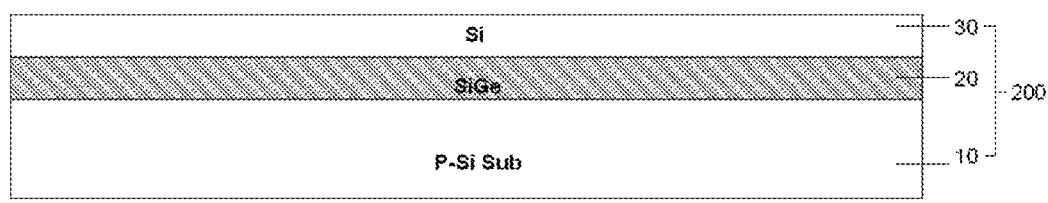
FIGS. 2a-2g show the manufacturing steps of a CMOS device, consistent with some embodiments of the current disclosure.

FIG. 2a shows an integrated substrate 200, formed from a Si substrate 10, a SiGe layer 20 on the Si substrate 10, and a Si layer 30 on the SiGe layer 20. In FIG. 2a, a P-type Si substrate is shown for a NMOS, but the substrate can be N-type for a PMOS device. The SiGe layer 20 can be deposited over the Si substrate 10 in a number of ways, including epitaxial growth, CVD, PEPVD, or other thin film deposition techniques.

Figure 2B:
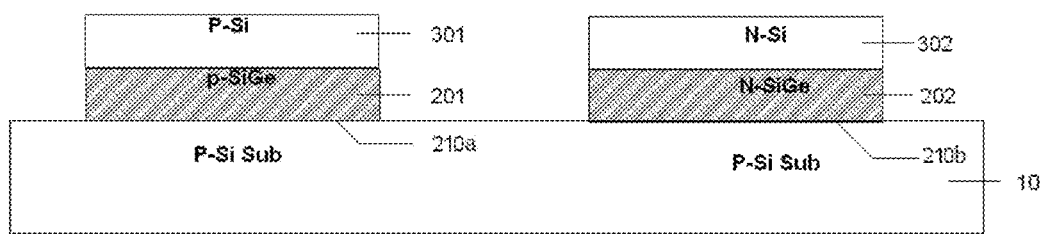

FIG. 2b describes the next step forming an active NMOS stack 210a and an active PMOS stack 210b. First an etching process is used to separate NMOS stack 210a at left from PMOS stack 210b at right. Then a doping process, such as ion implantation technique, is applied to dope the left side film stack in order to form a P-type SiGe layer 201 and a P-type Si layer 301 on the Si substrate 10. Similarly, a similar doping technique is applied at the right side film stack in order to form N-type SiGe layer 202 and N-type Si layer 302 on the Si substrate 10. The P-type Si layer 301 and the N-type Si layer 302 are dedicated for forming a NMOS active region and a PMOS active region respectively.

Figure 2C:
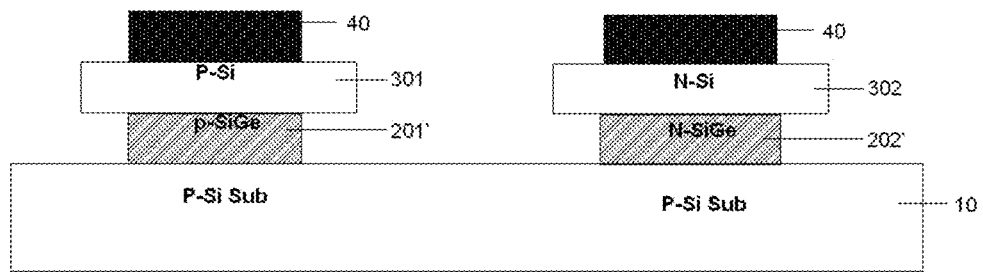

In FIG. 2c, a photo resist layer 40 is coated on the P-type Si layer 301 and the N-type Si layer 302 to cover the first region used for forming a gate channel, which spreads outwards from both sides to cover partial sidewalls of the P-type SiGe layer 201 and the N-type SiGe layer 202 under this region. Then, a selective undercut etching process removes a part of the P-type SiGe layer 201 under the P-type Si layer 301, and a part of N-type SiGe layer 202 under the N-type Si layer 302. A number of selective etching techniques can be applied to achieve the desired under-cut etching. For example, a sub-atmospheric chemical vapor deposition (SACVD) method is applied with $H_2$ and HCl gases in a temperature range from 600° C. to 800° C. and at a HCl pressure above 300 Torr. The post-etch SiGe islands—the P-type SiGe isolation layer 201' and N-type SiGe isolation layer 202' are located under the out-hanging active P-Si layer 301 and N-Si layer 302. The active P-type Si layer 301 forms an active gate channel in the center region, a source region and a drain region formed at the two opposite ends of the gate channel for the NMOS device. Similarly, the active N-type Si layer 302 forms an active gate channel in the center region, a source region and a drain region formed at the two opposite ends of the gate channel for the PMOS device.

Figure 2D:
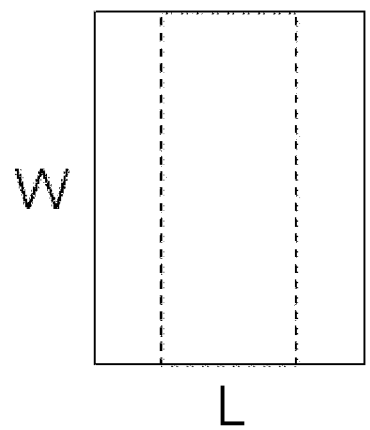

FIG. 2d is a top view of a single MOS device structure, as the solid box represents the boundaries of the active Si layer and the dashed box represents the underlying SiGe region. In FIG. 2d, L is the device length along the gate channel, and W is the device width.

Figure 2E:
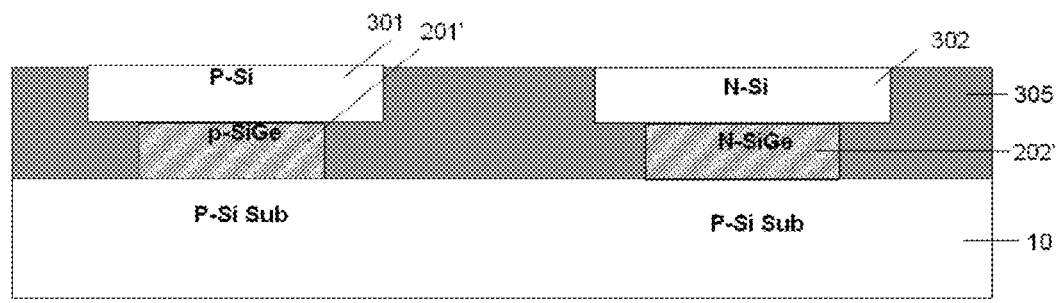

In the next step FIG. 2e, photo resist layer 40 is removed, and a dielectric medium 305 fills the gaps around P-type SiGe isolation layer 201', P-type Si layer 301, N-type SiGe isolation layer 202' and N-type Si layer 302 above the Si substrate 10. To level the top surface after filling, the surface is polished by a chemical mechanical polishing process.

Figure 2F:
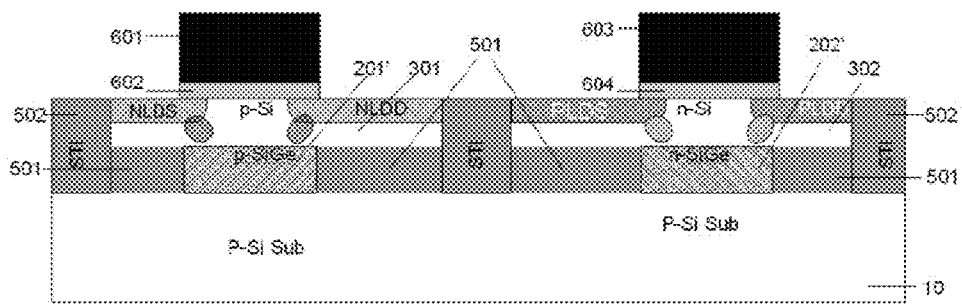

In FIG. 2f, a gate region is created above the P-type Si layer 301 and the N-type Si layer 302 each. The NMOS gate includes a gate dielectric layer 602 under a gate electrode 601, and the PMOS gate includes a gate dielectric layer 604 under a gate electrode 603. Then, source and drain are formed by a doping technique such as ion implantation in P-type Si layer 301, and similarly in N-type Si layer 302. Gate structure can be fabricated in a number of ways. For example, lightly-doped-sources (NLDS and PLDS), lightly-doped-drains (NLDD and PLDD), and halos can be formed first, followed by highly doped sources and drains by high density ion implantation.

As described above, a buried insulator layer 501 is formed under P-type Si layer 301 and N-type Si layer 302 each to complete the structure. Two semiconductor regions 201' and 202' each form a connecting passage within the structure to release floating charges and to diffuse heat. The connecting passage may include semiconductor materials such as SiGe.

FIG. 2f also shows forming of the shallow trench isolation regions 502 around the P-type Si layer 301 and the N-type Si layer 302.

Figure 2G:
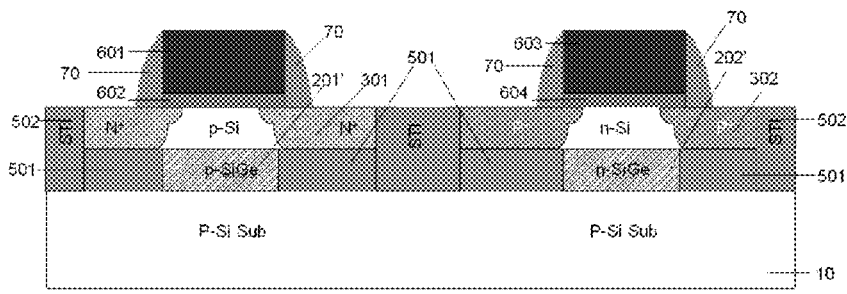

FIG. 2g shows a cross sectional view of the CMOS device after adding insulation spacers 70 around the gates.

The disclosed SOI MOS device eliminates floating body effects and self-heating effects by having the semiconductor SiGe layer between the active gate channel and the Si substrate. The heat and charge generated in device operation are released from the active channel to the Si substrate through the SiGe. The simplicity of the device fabrication as disclosed above makes implementation of the technique practical.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A MOS device for eliminating floating body effects and self-heating effects, the MOS device comprising:
   a semiconductor substrate;
   a Si active region formed on the substrate, wherein the active region including a gate channel, a source region and a drain region formed at the two opposite ends of the gate channel;
   a gate region formed over the gate channel;
   a buried insulation layer formed between the substrate and the source and drain regions;
   a SiGe isolation layer formed between the gate channel and the substrate as an electric and thermo passage between them, wherein the SiGe isolation layer is formed by priority epitaxial growing and selective etch process and is in contact with the substrate; and
   a shallow trench isolation region located surrounding the active region.

2. The MOS device of claim 1, wherein the gate further comprises a plurality of insulation spacers.

3. The MOS device of claim 1, wherein the buried insulation layer comprises silicon oxide or silicon nitride.

4. The MOS device of claim 1, wherein the semiconductor substrate comprises Si substrate.

5. The MOS device of claim 1, wherein the SiGe layer is P-type doped in a NMOS device.

6. The MOS device of claim 1, wherein the SiGe layer is N-type doped in a PMOS device.

* * * * *